(12) United States Patent
Wada et al.

(10) Patent No.: US 7,241,348 B2
(45) Date of Patent: Jul. 10, 2007

(54) FLUX FOR SOLDER PASTE AND SOLDER PASTE

(75) Inventors: Kenichi Wada, Tokyo (JP); Shoichi Nakaji, Oome (JP)

(73) Assignee: Tokyo First Trading Co., Ltd., Tokyo (JP)

( * ) Notice: Subject to any disclaimer, the term of this patent is extended or adjusted under 35 U.S.C. 154(b) by 369 days.

(21) Appl. No.: 10/349,283

(22) Filed: Jan. 22, 2003

(65) Prior Publication Data

US 2003/0168123 A1 Sep. 11, 2003

(30) Foreign Application Priority Data

Mar. 7, 2002 (JP) .............................. 2002-061639

(51) Int. Cl.
*B23K 35/365* (2006.01)

(52) U.S. Cl. ....................................................... 148/24

(58) Field of Classification Search .................... 148/24
See application file for complete search history.

(56) References Cited

U.S. PATENT DOCUMENTS

| | | | | |
|---|---|---|---|---|
| 3,944,123 A | * | 3/1976 | Jacobs | 228/223 |
| 4,113,525 A | * | 9/1978 | Stayner et al. | 148/23 |
| 4,960,236 A | * | 10/1990 | Hedges et al. | 228/180.1 |
| 5,150,832 A | * | 9/1992 | Degani et al. | 228/224 |
| 5,417,771 A | * | 5/1995 | Arita et al. | 148/23 |
| 5,904,782 A | * | 5/1999 | Diep-Quang | 148/23 |
| 5,985,456 A | * | 11/1999 | Zhou et al. | 428/414 |
| 6,059,894 A | * | 5/2000 | Pendse | 148/23 |
| 6,641,679 B2 | * | 11/2003 | Nishina et al. | 148/24 |

FOREIGN PATENT DOCUMENTS

| | | | |
|---|---|---|---|
| EP | 1317991 A2 | * | 6/2003 |
| JP | 06063788 A | | 3/1994 |
| JP | 3105505 B1 | * | 11/2000 |
| JP | 2001138089 A2 | | 5/2001 |

* cited by examiner

*Primary Examiner*—Daniel Jenkins
(74) *Attorney, Agent, or Firm*—Flynn, Thiel, Boutell & Tanis, P.C.

(57) ABSTRACT

A flux for solder paste contains a dicarboxylic acid of carbon number 3 to 5 and a dicarboxylic acid of carbon number 15 to 20 as an activator, which prevents skinning or changes by aging of viscosity. In actual use, the solder paste of the present invention can maintain good coating and printing ability for long time, further can endure preheating under high temperatures.

4 Claims, No Drawings

FLUX FOR SOLDER PASTE AND SOLDER PASTE

FIELD OF THE INVENTION

The present invention relates to a flux for solder paste and a solder paste characterized in that changes in quality by aging are very small and it is resistant to preheating under high temperatures.

DESCRIPTION OF THE PRIOR ART

The preparation method of a packaging substrate according to the following process is broadly practiced up to the present. That is, the solder paste is prepared by kneading a solder metal powder with a flux mainly composed of a rosin resin and derivatives thereof. Then said solder paste is coated and printed over the surface of a printed circuit and the necessary parts are installed, after that the soldering metal is fused by heating.

Recently, the parts to be installed to the packaging substrate are becoming more compact and the packaging density of it is becoming higher. Further, the solder paste alloy itself is required to be lead free. Therefore, the requirement for the development of a solder paste which can maintain a good coating and printing adaptability for a long period of time and has good resistance to preheating under a high temperature is becoming more serious. For the purpose to respond to the above-mentioned requirement, various discussions are continued and various proposals are provided. For instance, a creamy solder prepared by kneading a flux and a solder powder containing 0.01–6 wt. % of a ring opened dicarboxylic acid or salt of it of carbon number 12 to 30, which is solid at normal temperatures is disclosed in JP Patent Laid-open publication 6-63788. In JP Patent Laid-open publication 2001-138089, zinc-containing solder flux which contains a fatty acid whose melting point is higher than 50° C. and an organic halogenide whose melting point is higher than 100° C. and does not react substantially with zinc as an activator is disclosed. However, the products disclosed in these documents, are insufficient to satisfy the above mentioned current requirement.

The reason why the products disclosed in these documents are insufficient is because the mechanism of change in quality of the solder paste greatly participates. That is, as the typical change in quality of the solder paste by aging, the "skinning" phenomenon can be mentioned. Said "skinning" phenomenon can be illustrated as follows, namely the viscosity of the solder paste is changed and hardened at the surface of the solder paste and the surface begins to look like it has a skin. Said change is caused by the reaction of the solder paste with oxygen or humidity in the atmosphere or by the reaction of an alloy contained in the solder paste with an activator and an organic acid contained in the flux. Said phenomenon can be avoided by reducing the changes in quality of the solder paste by aging, that is, by not using a halogenide activator or a conventional organic acid.

However, on the other hand, when the chemicals mentioned above are not used, it is difficult to maintain good soldering ability. Even if one of these abilities is satisfied, the total ability as a solder paste is not perfect. Therefore, the development of a solder paste which prevents the skinning phenomenon and the viscosity change by aging of solder paste and, further, can preserve good coating and printing ability for a long term in actual use and has a good resistance to preheating under high temperatures has been expected.

THE OBJECT OF THE PRESENT INVENTION

The inventors of the present invention have carried out intensive study to develop a solder paste which prevents the skinning phenomenon and the viscosity change by aging of solder paste and, further, can preserve good coating and printing ability for long term in actual use and has a good resistance to preheating under a high temperature. The inventors of the present invention have found out that the object can be obtained by containing at least one dicarboxylic acid of carbon number 3 to 5 and at least one dicarboxylic acid of carbon number 15 to 20 as an activator in a flux and accomplished the present invention. That is, the object of the present invention is to provide a solder paste which prevents viscosity change by aging, can preserve a good coating and printing ability for a long term in actual use and has a good resistance to preheating under high temperatures.

BRIEF SUMMARY OF THE INVENTION

The first important point of the present invention is a flux for solder paste containing dicarboxylic acid of carbon number 3 to 5 and dicarboxylic acid of carbon number 15 to 20 as an activator. The second important point of the present invention is a solder paste comprising a flux containing dicarboxylic acid of carbon number 3 to 5 and dicarboxylic acid of carbon number 15 to 20 as an activator and a solder alloy.

The action of the present invention is not yet made clear, however, the presumed action of the present invention can be illustrated as follows. Namely, a part of a dicarboxylic acid of carbon number 3 to 5 contained in flux forms a salt with a metal which is a component of solder powder during the kneading process of the flux with the solder powder and coats the surface of solder powder and the changes in quality by aging such as viscosity change or the skinning phenomenon can be prevented by said coating action. In the meanwhile, since the reactivity of the dicarboxylic acid of carbon number 15 to 20 is slow, it hardly reacts with the solder powder during the kneading process of the flux and the solder powder, and does not have influence on the coating and printing process for long period or during the preheating under a high temperature. However, close to the fusing temperature of the solder paste, the function of it as an activator can be extracted sufficiently and displays good soldering ability. That is, by the synergistic effect of the use together of these said dicarboxylic acids, the aimed object of the present invention can be accomplished.

DETAILED DESCRIPTION OF THE INVENTION

The present invention will be explained more in detail according to the following description.

As a specific example of a dicarboxylic acid of carbon number 3 to 5 used as an activator in the present invention, malonic acid, succinic acid, maleic acid, fumaric acid or glutaric acid can be mentioned. While, as a specific example of a dicarboxylic acid of carbon number 15 to 20, pentadecane di-acid ($C_{15}H_{28}O_4$), hexadecane di-acid ($C_{16}H_{30}O_4$), heptadecane di-acid ($C_{17}H_{32}O_4$), octadecane di-acid ($C_{18}H_{34}O_4$), nonadecane di-acid ($C_{19}H_{36}O_4$) or eicosanoic di-acid ($C_{20}H_{38}O_4$) can be mentioned. Particularly, the combination of succinic acid or malonic acid as the dicarboxylic acid of carbon number 3 to 5 and $C_{20}H_{38}O_4$ or $C_{16}H_{30}O_4$ as the dicarboxylic acid of carbon number 15 to 20 is desirable.

The amount of these dicarboxylic acids to be used are mentioned as follows. The amount of the dicarboxylic acid of carbon number 3 to 5 is 0.05 to 5 wt. %. When the amount is smaller than 0.05 wt. %, the forming of a coating film on the surface of the solder powder is not perfect and a sufficient effect cannot be expected and, when larger than 0.05 wt. %, although the effect is good, the reliability of the flux is deteriorated. Especially, when the amount of dicarboxylic acid of carbon number 3 to 5 is larger than 5 wt. %, it is difficult to maintain good reliability. The desirable amount of dicarboxylic acid of carbon number 3 to 5 is 0.1 to 3 wt. %.

The amount of dicarboxylic acid of carbon number 15 to 20 is 6 to 30 wt. %. When the amount is smaller than 6 wt. %, the amount of rosin becomes too small and causes the deterioration of tacking so that the sufficient printing ability cannot be maintained. The desirable amount of dicarboxylic acid of carbon number 15 to 20 is 7–25 wt. %.

To the flux of the present invention, a thixotropic agent, a defoaming agent, an antioxidant, an anticorrosion agent, a surface active detergent or a thermosetting agent, which are used in conventional flux, can be blended when the necessity arises. Namely, as a thixotropic agent to be added for the purpose to adjust the viscosity, hardened castor oil or fatty acid amide which are used to the ordinary flux can be used. The thixotropic agent can be blended in the limitation of smaller than 20 wt. % to the flux.

The solder powder alloy used in the solder paste of the present invention is an alloy containing a metal such as Sn, Pb, Ag, Cu, In, Zn, Bi, Pd, Ni or Al.

Specifically, a binary alloy represented by Sn—Pb, Sn—Ag, Sn—In or Sn—Zn or a tertiary alloy or more multiple alloys combined said binary alloy with one or more metals selected from the group consisting of Cu, Bi, In, Ni, Ge, Sb, Zn or Pb can be mentioned. Especially, in the case of Sn—Pb alloy, which is the Pb free alloy, the sufficient effect can be displayed.

EXAMPLES

The present invention will be illustrated more readily through the following Examples, however, it is not intended to limit the scope of the claims of the present invention to these Examples.

The changes by aging in qualities such as continuous printing ability, solder ball, wettability and viscosity of the solder paste are measured. The measuring methods are illustrated as follows.

① Continuous printing ability: The printing is carried out continuously using a metal mask and block passing through ability and antiblotting ability are estimated.

② Solder ball: The solder paste is printed on a substrate, and after reflow the presence of solder ball is observed and inspected by a magnifying glass.

I . . . no solder ball

III . . . many solder balls are observed

③ Wettability: The solder paste is printed on a substrate and a part is mounted. After reflow, the wetting state of the part is observed by a magnifying glass.

⊙ . . . good

Δ . . . not wetted portion is observed

④ Viscosity: Measured according to JIS-Z-3284 standard using a Spiral viscosity meter PCU-205 (product of MARUCOM Co., Ltd.)

Example 1

|  | weight part (%) |
|---|---|
| Sn-3.0 Ag-0.5 Cu (25–45 μm) | 90.0 |
| Modified rosin | 5.2 |
| Hardened castor oil | 0.4 |
| Cyclohexylamine hydrobrominate | 0.3 |
| Succinic acid ($C_4H_6O_4$) | 0.2 |
| Eicosanoic di-acid ($C_{20}H_{38}O_4$) | 1.0 |
| Ethylene glycol monobutylether | 2.9 |

A solder paste of the above mentioned blending ratio is prepared and changes by aging in qualities of continuous printing ability, solder ball, wettability and viscosity are measured according to the above mentioned measuring method.

The obtained results are shown in Table 1.

Example 2

|  | weight part (%) |
|---|---|
| Sn-3.0 Ag-0.5 Cu(25–45 μm) | 90.0 |
| Modified rosin | 5.5 |
| Hardened castor oil | 0.4 |
| Cyclohexylamine hydrobrominate | 0.3 |
| Malonic acid ($C_3H_4O_4$) | 0.2 |
| Hexadecane di-acid ($C_{16}H_{30}O_4$) | 1.0 |
| Ethylene glycol monobutylether | 2.6 |

A solder paste of the above mentioned blending ratio is prepared and changes by aging in qualities of continuous printing ability, solder ball, wettability and viscosity are measured according to the above mentioned measuring method.

The obtained results are shown in Table 1.

Comparative Example 1

|  | weight part (%) |
|---|---|
| Sn-3.0 Ag-0.5 Cu(25–45 μm) | 90.0 |
| Modified rosin | 5.7 |
| Hardened castor oil | 0.4 |
| Cyclohexylamine hydrobrominate | 0.3 |
| Eicosanoic di-acid ($C_{20}H_{38}O_4$) | 1.0 |
| Ethylene glycol monobutylether | 2.6 |

A solder paste of the above mentioned blending ratio is prepared and changes by aging in qualities of continuous printing ability, solder ball, wettability and viscosity are measured according to the above mentioned measuring method.

The obtained results are shown in Table 1.

Comparative Example 2

|  | weight part (%) |
|---|---|
| Sn-3.0 Ag-0.5 Cu(25–45 μm) | 90.0 |
| Modified rosin | 6.0 |
| Hardened castor oil | 0.4 |
| Cyclohexylamine hydrobrominate | 0.3 |
| Malonic acid ($C_3H_4O_4$) | 0.2 |
| Ethylene glycol monobutylether | 3.1 |

A solder paste of the above mentioned blending ratio is prepared and changes by aging in qualities of continuous printing ability, solder ball, wettability and viscosity are measured according to the above mentioned measuring method.

The obtained results are shown in Table 1.

TABLE 1

|  | Initial date continuous printing ability | High temp. previous heating | | Viscosity change (Pa · s) refrigerate | | |
|---|---|---|---|---|---|---|
|  |  | solder ball | wettability | Initial | 1 month | 3 months |
| Exmp.1 | >16 hrs | I | ⊚ | 200 | 210 | 197 |
| Exmp.2 | >16 hrs | I | ⊚ | 185 | 192 | 192 |
| Comp. Exmp.1 | <8 hrs | III | Δ | 194 | 245 | 370 |
| Comp. Exmp.2 | >16 hrs | Insoluble | insoluble | 179 | 170 | 175 |

EFFECT OF THE INVENTION

As mentioned above, the solder paste containing a dicarboxylic acid of carbon number 3 to 5 and a dicarboxylic acid of carbon number 15 to 20 as an activator prevents skinning or changes by aging of viscosity. In actual use, the solder paste of the present invention can maintain good coating and printing ability for long time and further can endure pre-heating under high temperatures.

What is claimed is:

1. A flux for solder paste, said flux comprising at least one of succinic acid and malonic acid and at least one of eicosanoic dicarboxylic acid and hexadecane dicarboxylic acid as an activator and at least one other flux component.

2. The flux for solder paste of claim 1, wherein the content of the at least one of succinic acid and malonic acid is 0.05–5 wt. % and the content of the at least one of eicosanoic dicarboxylic acid and hexadecane dicarboxylic acid is 6–30 wt. %.

3. A solder paste comprising the flux for solder paste according to claim 1 and a solder metal.

4. A solder paste comprising the flux for solder paste according to claim 2 and a solder metal.

* * * * *